US012805060B2

(12) United States Patent
Kwangkaew et al.

(10) Patent No.: US 12,805,060 B2
(45) Date of Patent: Nov. 17, 2026

(54) OPTICAL SENSOR WITH LIGHT PIPE AND METHOD OF MANUFACTURE

(71) Applicants: Vanapong Kwangkaew, Wang Noi (TH); Sanjay Mitra, Colorado Springs, CO (US); Sirirat Silapapipat, Ladroad (TH)

(72) Inventors: Vanapong Kwangkaew, Wang Noi (TH); Sanjay Mitra, Colorado Springs, CO (US); Sirirat Silapapipat, Ladroad (TH)

(73) Assignee: HANA SEMICONDUCTOR (AYUTTHAYA) CO., LTD., Ayutthaya (TH)

( * ) Notice: Subject to any disclaimer, the term of this patent is extended or adjusted under 35 U.S.C. 154(b) by 868 days.

(21) Appl. No.: 17/721,274

(22) Filed: Apr. 14, 2022

(65) Prior Publication Data

US 2022/0352395 A1 Nov. 3, 2022

Related U.S. Application Data

(60) Provisional application No. 63/176,271, filed on Apr. 17, 2021.

(51) Int. Cl.

| | |
|---|---|
| ***H10F 77/40*** | (2025.01) |
| ***H10F 71/00*** | (2025.01) |
| ***H10F 77/30*** | (2025.01) |
| ***H10F 77/50*** | (2025.01) |
| *G02B 5/02* | (2006.01) |
| *G02B 5/20* | (2006.01) |

(52) U.S. Cl.

CPC ........... *H10F 77/413* (2025.01); *H10F 71/00* (2025.01); *H10F 77/334* (2025.01); *H10F 77/337* (2025.01); *H10F 77/50* (2025.01); *G02B 5/021* (2013.01); *G02B 5/0278* (2013.01); *G02B 5/20* (2013.01)

(58) Field of Classification Search

CPC ..... H10F 77/122–1228; H10F 39/8053; H10F 39/8057; H10F 77/413; H10F 71/00; H10F 77/334; H10F 77/337; H10F 77/50

See application file for complete search history.

(56) References Cited

U.S. PATENT DOCUMENTS

| | | | | |
|---|---|---|---|---|
| 4,785,338 A * | 11/1988 | Kinoshita | H10F 77/334 | 257/434 |
| 7,227,236 B1 * | 6/2007 | Lee | H10F 39/011 | 257/434 |
| 10,043,924 B1 * | 8/2018 | Kaufmann | H10F 77/50 | |
| 2001/0020738 A1 * | 9/2001 | Lizima | H10F 39/8057 | 257/680 |

(Continued)

FOREIGN PATENT DOCUMENTS

DE 102004059233 A1 * 6/2006 ............. H10F 71/00

*Primary Examiner* — Scott B Geyer

(74) *Attorney, Agent, or Firm* — West & Associates, A PC; Stuart J. West

(57) ABSTRACT

An optical sensor comprising a substrate, a silicon layer having an optical sensor, light block material covering at least portions of said silicon layer and the substrate, defining a light pipe aperture above the optical sensor; and an optical layer positioned within the light pipe aperture. In some embodiments, the light pipe aperture is at least partially filled with a light transmissive material.

9 Claims, 6 Drawing Sheets

(56) References Cited

U.S. PATENT DOCUMENTS

2003/0124773 A1* 7/2003 Hashimoto ............ H04N 23/57
257/E31.127
2003/0201507 A1* 10/2003 Chen ........................ H10F 77/50
257/E31.118
2004/0080029 A1* 4/2004 Chow .................... H04N 23/54
257/676
2005/0185088 A1* 8/2005 Kale ..................... H10F 77/407
257/E31.127
2005/0275746 A1* 12/2005 Nishida ................ G02B 13/008
257/E31.127
2006/0023108 A1* 2/2006 Watanabe ........... H10F 39/8053
348/335
2006/0290802 A1* 12/2006 Webster ................. H04N 23/55
348/340
2010/0244171 A1* 9/2010 Nagamatsu ............ H04N 23/57
257/E31.113
2010/0259657 A1* 10/2010 Lee ....................... H10F 39/804
348/294
2011/0156188 A1* 6/2011 Tu ........................ H10F 39/8057
257/E31.127
2012/0001284 A1* 1/2012 Tut ........................ H10F 30/223
257/E31.127
2014/0353788 A1* 12/2014 Jin .......................... H10F 77/50
257/434
2017/0345961 A1* 11/2017 Shentu .................. G01J 1/0271
2018/0240839 A1* 8/2018 Egami ..................... H10F 77/00
2018/0277583 A1* 9/2018 Harazono ........... H10F 39/8057
2019/0081028 A1* 3/2019 Komiyama ........... H10W 90/00
2019/0089883 A1* 3/2019 Shen ...................... H04N 23/57
2019/0165020 A1* 5/2019 Toschkoff ........... H10F 39/8067
2019/0393113 A1* 12/2019 Chen ..................... H10F 39/804
2019/0393254 A1* 12/2019 Chen ..................... H10F 39/024
2019/0393362 A1* 12/2019 Chen ....................... H10F 71/00
2020/0098808 A1* 3/2020 Wu ........................ H10F 39/806
2020/0098811 A1* 3/2020 Chen ................. H01L 21/76898
2020/0103613 A1* 4/2020 Shen ...................... H04N 23/54
2020/0105809 A1* 4/2020 Lee ........................ D21H 27/10
2020/0355837 A1* 11/2020 Matsunaga ............. H10F 77/20
2021/0050459 A1* 2/2021 Kummerl ............... G02B 5/208
2021/0233949 A1* 7/2021 Chino ................... H10F 39/011
2022/0139984 A1* 5/2022 Cho ...................... H10F 39/024
257/434
2022/0173256 A1* 6/2022 Koduri .................... H10F 71/00
2022/0238733 A1* 7/2022 Bito ...................... H10F 77/331
2022/0352227 A1* 11/2022 Otsuka .................. H10F 39/804

* cited by examiner

PRIOR ART

OPTICAL SENSOR WITH LIGHT PIPE AND METHOD OF MANUFACTURE

CROSS REFERENCE TO RELATED APPLICATIONS

This application claims priority under 35 U.S.C. § 119(e) from earlier filed U.S. Provisional Application Ser. No. 63/176,271, filed Apr. 17, 2021. The entirety of the above-listed provisional application is incorporated herein by reference.

BACKGROUND

Technical Field

The present device relates to the field of optical sensor and methods of manufacture therefor.

Background

FIG. 1 depicts a conventional optical sensor 100. As depicted, the optical sensor 100 consists of a substrate layer 102 with a silicon chip 104 in contact with a top surface of the substrate layer 102. A sensing area 106 is coupled with the silicon chip 104 and the silicon chip is coupled with the substrate 102 via one or more electrical couplings 108. The substrate 102, silicon chip 104, sensing area 106 and electrical couplings 108 are covered with a light transmissive (optically inert or substantially optically inert) material 110. Surrounding the substrate 102, the silicon chip 104, the sensing area, electrical couplings 108 and light transmissive material 110, is a housing 112 that is separated from the interior structure by a gap 114. In the common embodiment, the housing has a relatively thin thickness 116 and is only as thick as required to block undesired light from reaching the sensing area 106. However, manufacture can be complex and such structure can allow inadvertent triggering of the sensing area 106. What is needed is a sensor with an alternate structure such as an optical sensor with light pipe and method of manufacture.

BRIEF DESCRIPTION OF THE DRAWINGS

Further details of the present device are explained with the help of the attached drawings in which.

DETAILED DESCRIPTION

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Figure 1:
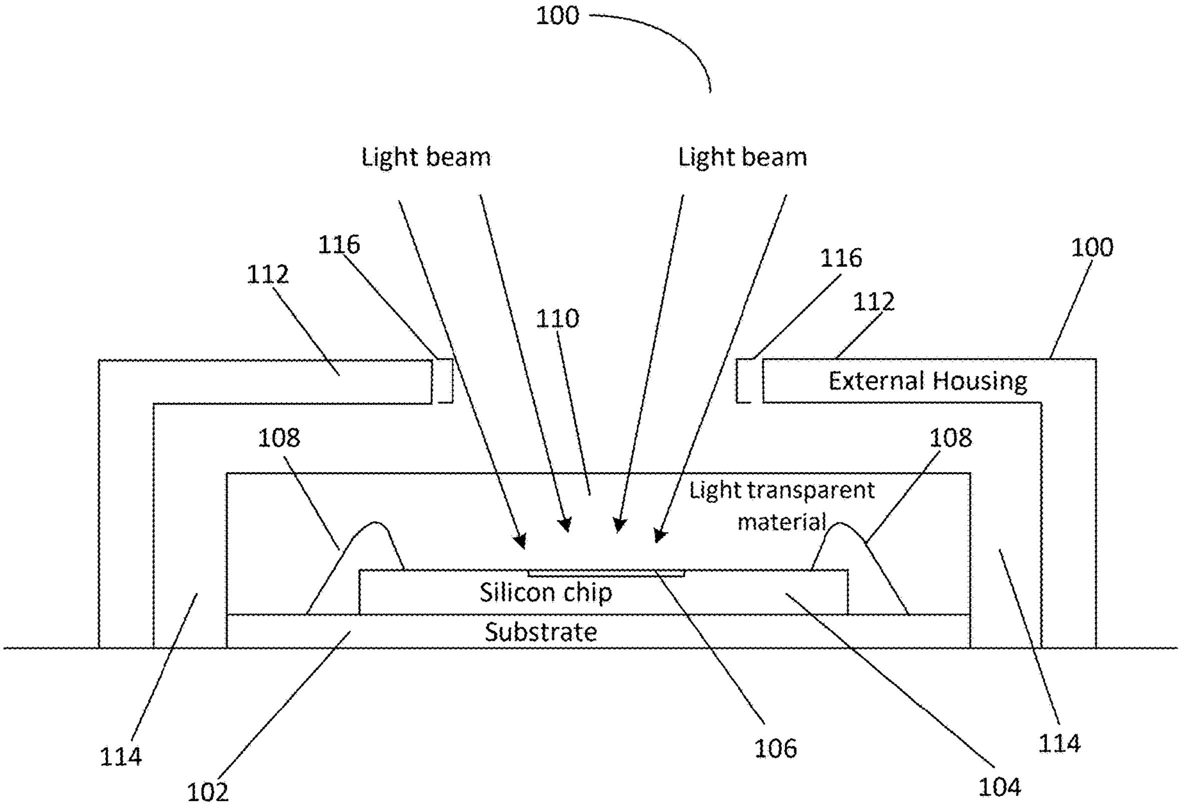
FIG. 1 depicts a prior art embodiment of an optical sensor.
Figure 2:
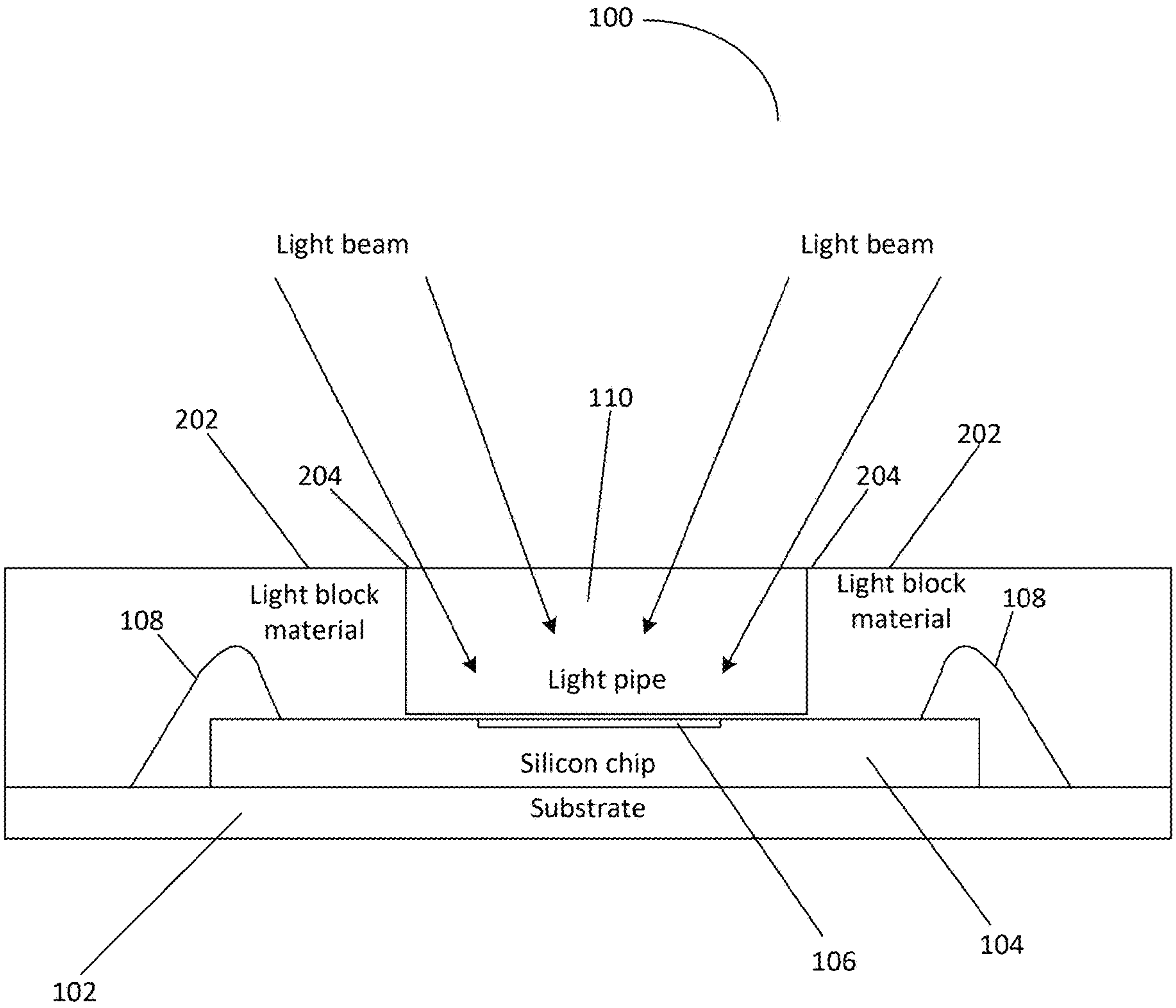
FIG. 2 depicts an embodiment of an optical sensor with a light pipe.

FIG. 2 depicts an embodiment of an optical sensor 100 with a light blocking optical layer 202. As depicted, the optical sensor 100 can comprise a substrate layer 102 with a silicon chip 104 in contact with a top surface of the substrate layer 102. A sensing area 106 can be coupled and/or integral with the silicon chip 104 and the silicon chip can be coupled with the substrate 102 via one or more electrical couplings 108.

In the embodiment depicted in FIG. 2, the sensor 100 can comprise a light blocking layer 202 defining a light pipe 204 that extends from the top surface of the light blocking material 202 to the surface of the silicon chip 104 and/or substrate 102. In some embodiments, the light pipe 204 can be filled or partially filled with a light transmissive (optically inert or substantially optically inert) material 110.

Figure 3:
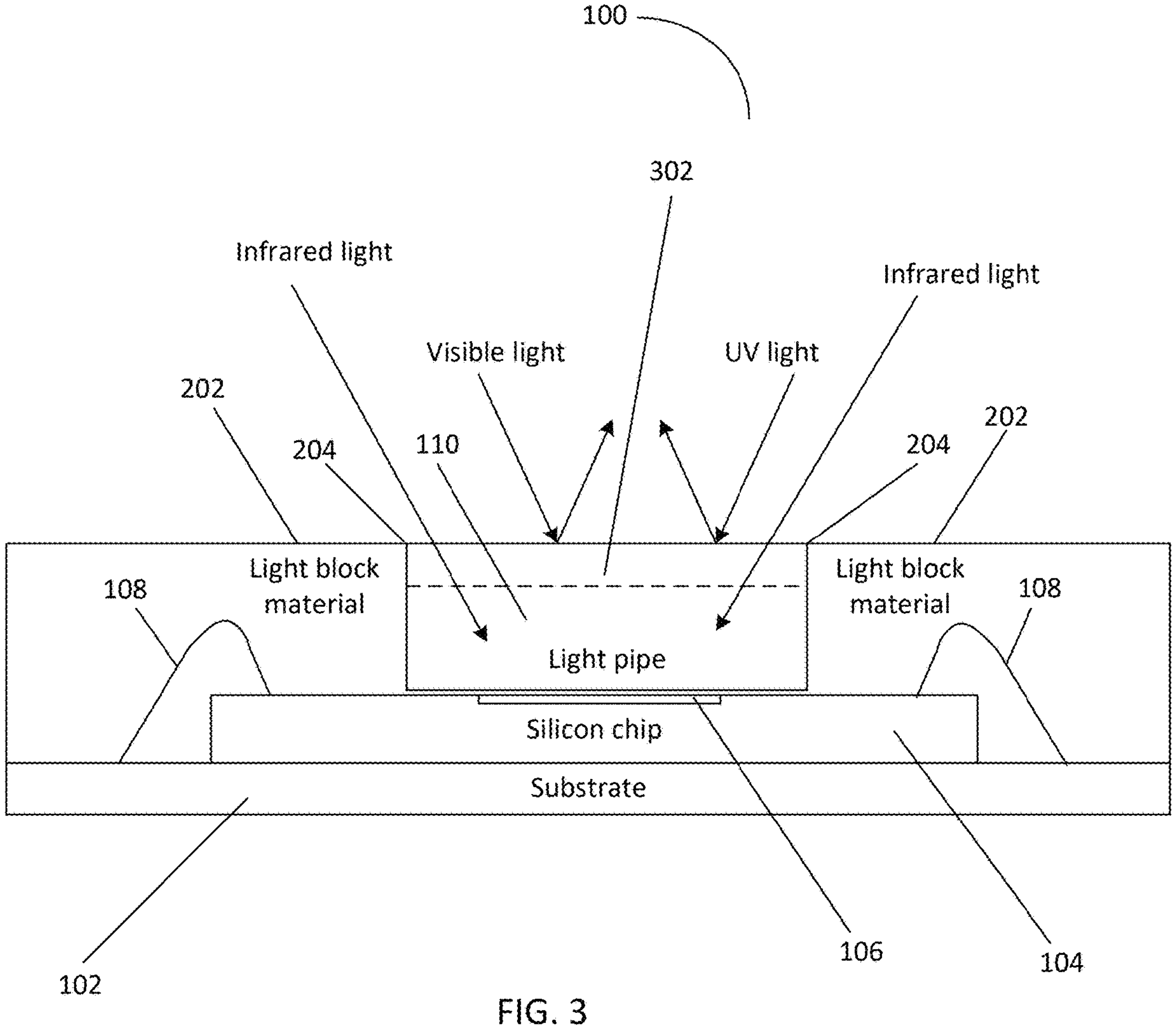
FIG. 3 depicts an embodiment of an optical sensor with a light pipe and filtering component.

FIG. 3 depicts an embodiment of an optical sensor 100 with a light filtering optical layer 302. As depicted, the optical sensor 100 can comprise a substrate layer 102 with a silicon chip 104 in contact with a top surface of the substrate layer 102. A sensing area 106 can be coupled and/or integral with the silicon chip 104 and the silicon chip can be coupled with the substrate 102 via one or more electrical couplings 108.

In the embodiment depicted in FIG. 3, the sensor 100 can comprise a light blocking layer 202 defining a light pipe 204 that extends from the top surface of the light blocking material 202 to the surface of the silicon chip 104 and/or substrate 102.

In some embodiments, the light pipe 204 can be filled or partially filled with a light transmissive (optically inert or substantially optically inert) material 110 and/or a light filtering material 302. In some embodiments the light filtering optical layer 302 can comprise any known convenient and/or desired material that is adapted and/or configured to selectively reflect, absorb and/or prohibit passage through the light filtering optical layer 302 of light having any desired wavelength and/or frequency and/or wavelength range and/or frequency range and/or wavelength ranges and/or frequency ranges. In operation, light of only desired wavelength(s) and/or frequency(ies) can pass through the light pipe 204/light filtering optical layer 302 and reach and/or be detected by the sensing area 106.

In some embodiments the light filtering optical layer 302 can be within the light pipe 204. However, in alternate embodiments, the light filtering optical layer 402 can be located above a light transmissive material 110 and one or more additional layers or gaps can be positioned between the light transmissive material 110 and the light filtering optical layer 302. Moreover, in some embodiments, the light filtering optical layer 302 can be continuous above the light transmissive material 110 and/or sensing area 106. However, in alternate embodiments, the light filtering optical layer 302 can be other than continuous and/or be periodically positioned above the light transmissive material 110 and/or sensing area 106.

Figure 4:
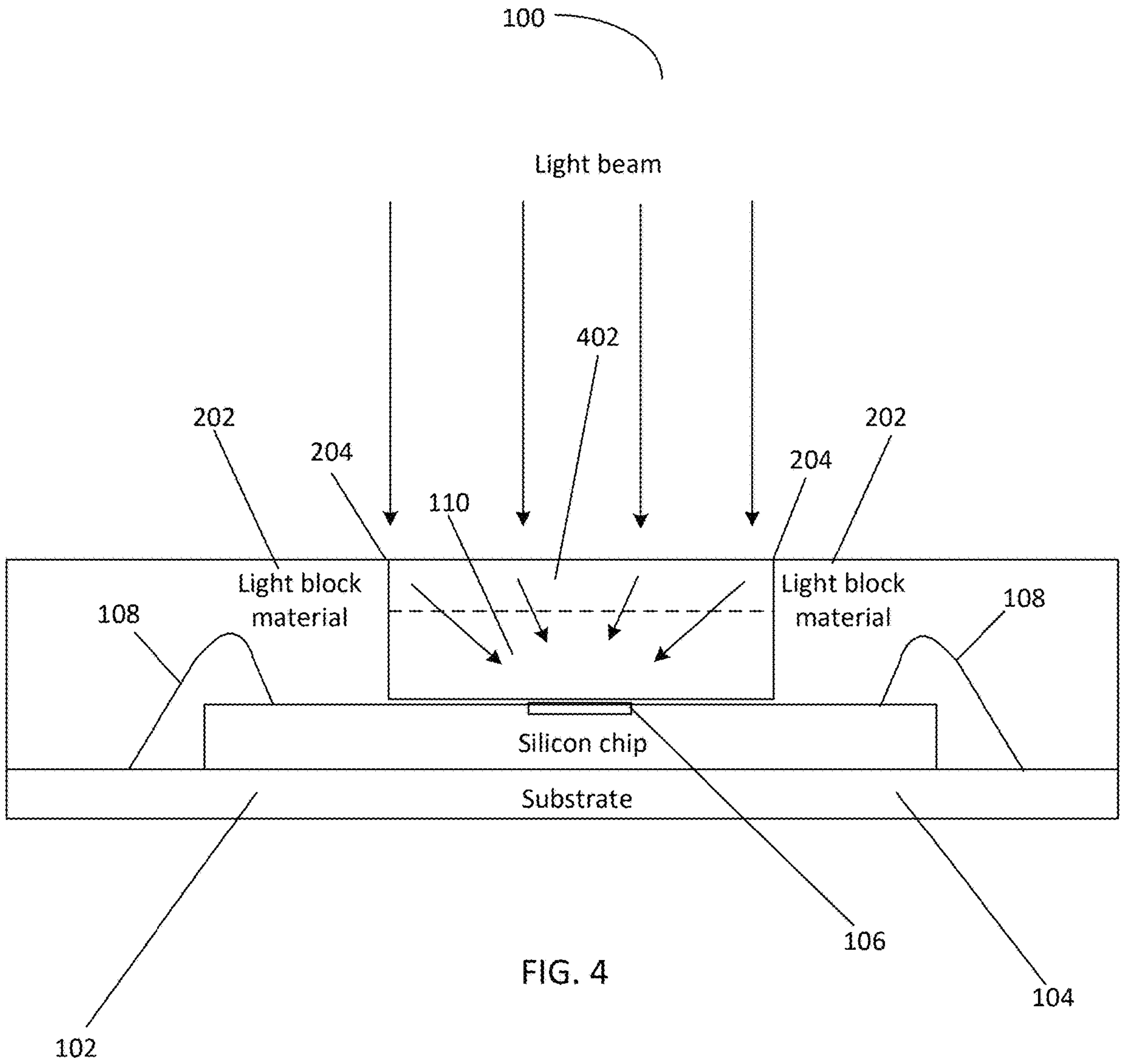
FIG. 4 depicts an embodiment of an optical sensor with a light pipe and light focusing component.

FIG. 4 depicts an embodiment of an optical sensor 100 with a light focusing optical layer 402. As depicted, the optical sensor 100 can comprise a substrate layer 102 with a silicon chip 104 in contact with a top surface of the substrate layer 102. A sensing area 106 can be coupled and/or integral with the silicon chip 104 and the silicon chip can be coupled with the substrate 102 via one or more electrical couplings 108.

In the embodiment depicted in FIG. 4, the sensor 100 can comprise a light blocking layer 202 defining a light pipe 204 that extends from the top surface of the light blocking material 202 to the surface of the silicon chip 104 and/or substrate 102.

In some embodiments, the light pipe 204 can be filled or partially filled with a light transmissive (optically inert or substantially optically inert) material 110 and/or a light focusing layer 402. In some embodiments the light focusing layer 402 can comprise any known convenient and/or desired material that is adapted and/or configured to selectively focus light (of any or only desired frequencies) passing through the light pipe 204 on the sensing area 106. In operation, light of only desired wavelength(s) and/or frequency(ies) can pass through the light pipe 204/light focusing layer 402 and be detected by the sensing area 106.

In some embodiments the light focusing layer 402 can be within the light pipe 204. However, in alternate embodiments, the light focusing optical layer 402 can be located above a light transmissive material 110 and one or more additional layers or gaps can be positioned between the light transmissive material 110 and the light focusing layer 402. Moreover, in some embodiments, the light focusing layer 402 can be continuous above the light transmissive material 110 and/or sensing area 106. However, in alternate embodiments, the light focusing layer 402 can be other than continuous and/or be periodically positioned above the light transmissive material 110 and/or sensing area 106.

Figure 5:
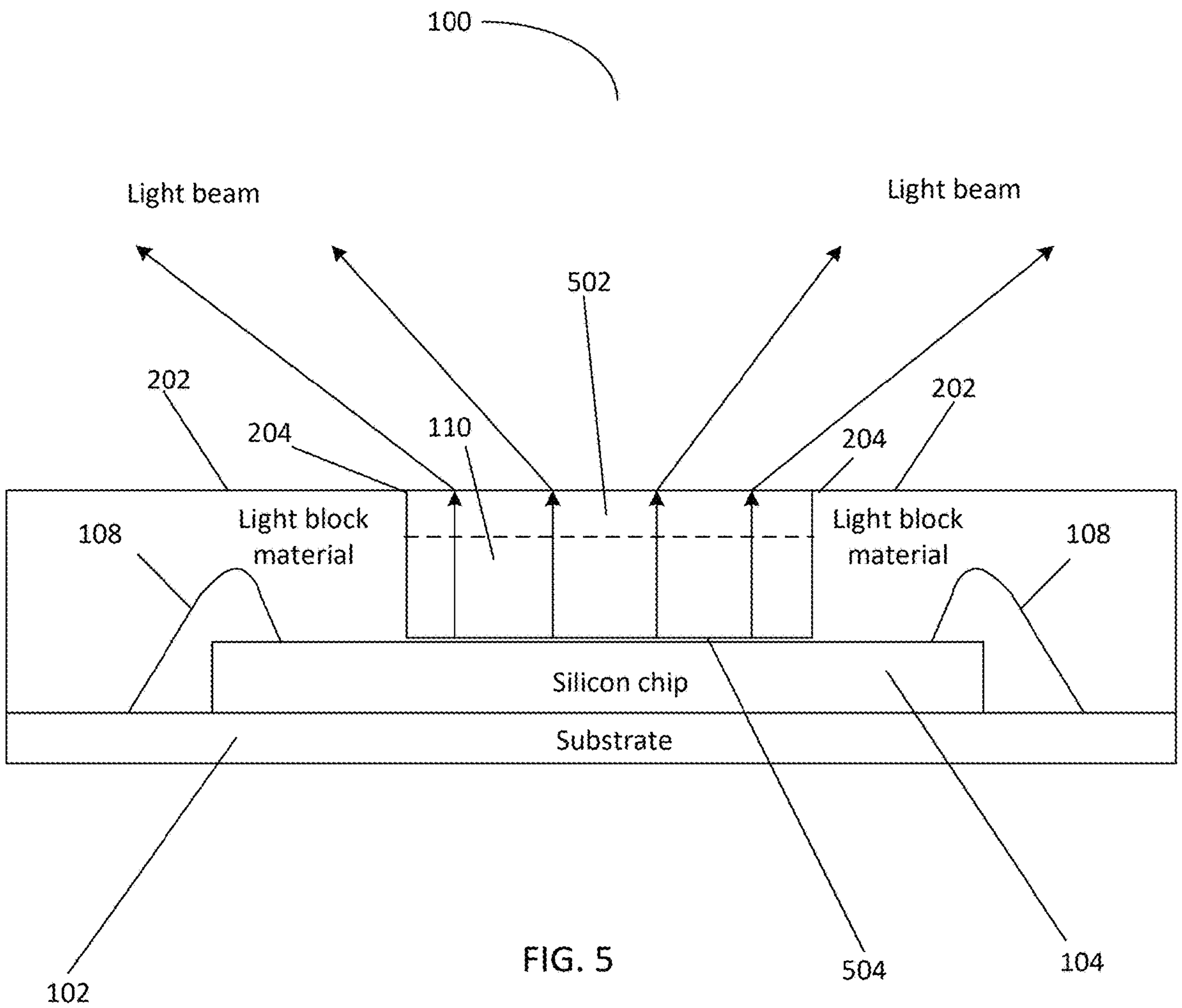
FIG. 5 depicts an embodiment of an optical sensor with a light pipe and a light spreading component.

FIG. 5 depicts an embodiment of a light emitter 500 with a light spreading optical layer 502. As depicted, the light emitter 500 can comprise a substrate layer 102 with a silicon chip 104 in contact with a top surface of the substrate layer 102. A emitting area 504 can be coupled and/or integral with the silicon chip 104 and the silicon chip can be coupled with the substrate 102 via one or more electrical couplings 108.

In the embodiment depicted in FIG. 5, the emitter 500 can comprise a light blocking layer 202 defining a light pipe 204 that extends from the top surface of the light blocking material 202 to the surface of the silicon chip 104 and/or substrate 102.

In some embodiments, the light pipe 204 can be filled or partially filled with a light transmissive (optically inert or substantially optically inert) material 110 and/or a light scattering layer 502. In some embodiments, the light scattering layer 502 can comprise any known convenient and/or desired material that is adapted and/or configured to selectively scatter light (of any or only desired frequencies) passing through the light pipe 204 from the light emitting area 504. In operation, light of only desired wavelength(s) and/or frequency(ies) can be scattered while passing through the light pipe 204/light scattering layer 402 and be detected by the sensing area 106.

In some embodiments the light scattering layer 502 can be within the light pipe 204. However, in alternate embodiments, the light scattering layer 502 can be located above a light transmissive material 110 and one or more additional layers or gaps can be positioned between the light transmissive material 110 and the light scattering layer 502. Moreover, in some embodiments, the light scattering layer 502 can be continuous above the light transmissive material 110 and/or the light emitting area 504. However, in alternate embodiments, the light scattering layer 502 can be other than continuous and/or be periodically positioned above the light transmissive material 110 and/or light emitting area 504.

Figure 6:
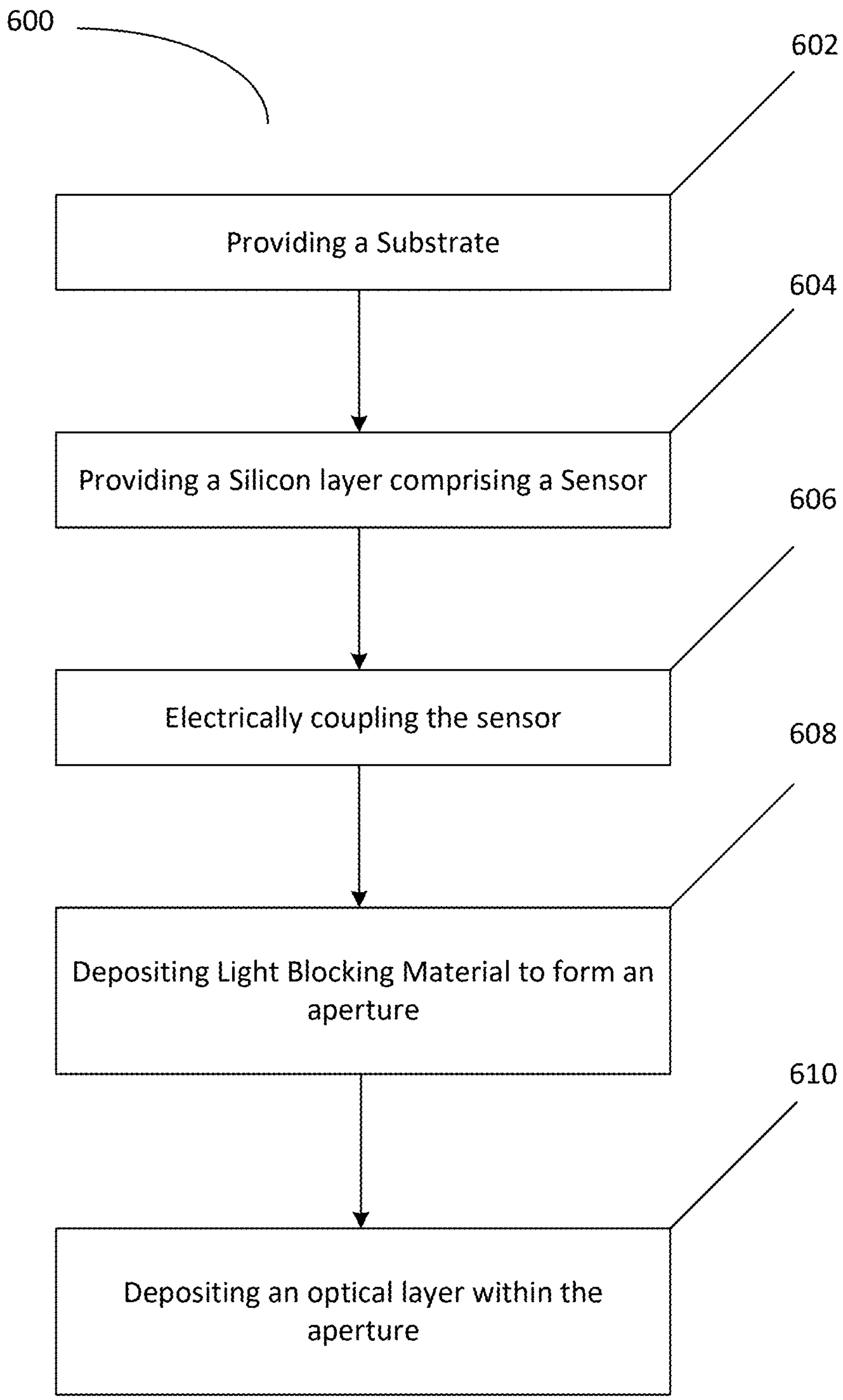
FIG. 6 depicts an embodiment of a method of manufacture of the optical sensor of FIGS. 1-5.

FIG. 6 depicts an embodiment of a method of manufacture of the optical sensor or emitter of FIGS. 1-5. In some embodiments, the method of manufacture of the optical sensor 100 or emitter 500 can comprise the steps of providing a substrate in step 602, providing a silicon layer 604 having a sensor or emitter area, electrically coupling the silicon layer with the substrate in step 606 then depositing a light blocking material over the substrate and silicon layer and/or substrate in step 608 such as to define an aperture above the light sensor or light emitter. In some embodiments, depositing an optical layer within the aperture.

Although exemplary embodiments of the invention have been described in detail and in language specific to structural features and/or methodological acts above, it is to be understood that those skilled in the art will readily appreciate that many additional modifications are possible in the exemplary embodiments without materially departing from the novel teachings and advantages of the invention. Moreover, it is to be understood that the subject matter defined in the appended claims is not necessarily limited to the specific features or acts described above. Accordingly, these and all such modifications are intended to be included within the scope of this invention construed in breadth and scope in accordance with the appended claims.

What is claimed:

1. An optical sensor comprising:

a substrate;

a silicon layer having an optical sensor;

light block material covering at least portions of said silicon layer and said substrate, defining a light pipe aperture above said optical sensor; and an optical layer positioned wholly within said light pipe aperture;

wherein said light pipe aperture is at least partially filled with a light transmissive material;

wherein the light filtering layer is located above a light transmissive material and one or more additional light filtering layers are positioned between the light transmissive material and the light filtering layer; and wherein gaps are positioned between the light transmissive material and the light filtering layer.

2. The optical sensor of claim 1, wherein said light pipe aperture is at least partially filled with a light transmissive material.

3. The optical sensor of claim 1, wherein said light filtering layer is located within the light pipe.

4. The optical sensor of claim 1, wherein the light filtering layer is substantially continuous above the light transmissive material.

5. The optical sensor of claim 1, wherein the light filtering layer is discontinuous within said light pipe.

6. The optical sensor of claim 5, wherein said one or more additional light filtering layers are intermittently, horizontally positioned above the light transmissive material.

7. An optical sensor comprising:

a substrate;

a silicon layer having an optical sensor;

light block material covering at least portions of said silicon layer and said substrate, defining a light pipe aperture above said optical sensor; and an optical layer positioned wholly within said light pipe aperture;

wherein said optical layer is a light filtering layer;

wherein the light filtering layer is located above a light transmissive material and one or more additional light filtering layers are positioned between the light transmissive material and the light filtering layer;

wherein the light filtering layer is discontinuous within said light pipe; and wherein said one or more additional light filtering layers are intermittently, horizontally positioned above the light transmissive material.

8. The optical sensor of claim 7, wherein said light pipe aperture is at least partially filled with a light transmissive material.

9. The optical sensor of claim 8, wherein said light filtering layer is located within the light pipe.

* * * * *